United States Patent [19]

Chappell

[11] 4,294,510
[45] Oct. 13, 1981

[54] SEMICONDUCTOR FIBER OPTICAL DETECTION

[75] Inventor: Terry I. Chappell, Amawalk, N.Y.

[73] Assignee: International Business Machines Corporation, Armonk, N.Y.

[21] Appl. No.: 101,960

[22] Filed: Dec. 10, 1979

[51] Int. Cl.³ .......................................... G02B 5/172
[52] U.S. Cl. ............................ 350/96.17; 29/576 T; 350/96.15; 357/30; 357/55
[58] Field of Search ............... 350/96.11, 96.12, 96.15, 350/96.17, 96.20, 96.18; 250/227, 552; 357/30, 31, 55, 60, 19; 29/576 T, 578, 579

[56] References Cited

U.S. PATENT DOCUMENTS

| | | | |
|---|---|---|---|
| 3,020,412 | 2/1962 | Byczkowski | 250/211 J |
| 3,255,055 | 6/1966 | Ross | 148/186 |
| 3,486,892 | 12/1969 | Rosvold | 430/314 |
| 3,593,067 | 7/1971 | Flynn | 357/32 |
| 3,879,606 | 4/1975 | Bean | 250/227 |
| 3,896,305 | 7/1975 | Ostrowsky et al. | 250/227 |
| 3,968,564 | 7/1976 | Springthorpe | 29/580 |
| 3,994,559 | 11/1976 | Crow | 350/96.17 |
| 4,063,268 | 12/1977 | King | 357/30 |
| 4,063,271 | 12/1977 | Bean et al. | 357/49 |
| 4,065,742 | 12/1977 | Kendall et al. | 338/9 |
| 4,079,507 | 3/1978 | King | 29/578 |
| 4,093,957 | 6/1978 | King et al. | 357/24 |
| 4,100,672 | 7/1978 | King et al. | 29/577 C |
| 4,127,862 | 11/1978 | Ilegems et al. | 357/30 |
| 4,130,343 | 12/1978 | Miller et al. | 350/96.15 |
| 4,131,984 | 1/1979 | Kaplow et al. | 29/572 |
| 4,137,543 | 1/1979 | Beneking | 357/30 |
| 4,152,713 | 5/1979 | Copeland et al. | 357/19 |
| 4,176,367 | 11/1979 | Uematsu | 357/19 |
| 4,210,923 | 7/1980 | North et al. | 357/30 |

OTHER PUBLICATIONS

Crow, "Integral Source/Receiver Package for Optical Data", *IBM Tech. Discl. Bull.*, vol. 20, No. 5, Oct. 1977, pp. 2089-2090.
Melchior, "Detectors for Lightwave Communication", *Physics Today*, Nov. 1977, pp. 32-39.
Conradi et al., "Fiber-Optical Transmission Between 0.8 and 1.4 µM", *IEEE Trans. on E.D.*, vol. ED-25, No. 2, Feb. 1978, pp. 180-193.
Chappell, "The V-Groove Multijunction Solar Cell", *Proc. of 13th IEEE Photovoltaic Spec. Conf.*, Washington, D.C., Jun. 1978.
Chappell, "The V-Groove Multijunction Solar Cell", *IEEE Trans. on E.D.*, vol. ED-26, No. 7, Jul. 1979, pp. 1091-1097.

*Primary Examiner*—John D. Lee
*Attorney, Agent, or Firm*—Alvin J. Riddles

[57] ABSTRACT

Semiconductor fiber optical-to-electrical signal conversion can be accomplished through the use of a detector made up of a semiconductor body having a width comparable to the signal conveying optical fiber diameter, the end of which is aligned with the width face of the semiconductor body, and n- and p- conductivity type regions are provided along the length dimension of the body, the magnitude of the length dimension further defining an optical path length within the body that is correlated with the light wavelength. Arrays of such structures can be offset ½ structure width and the groove between the sides of the structures may then be employed for optical fiber alignment to an adjacent detector. The detectors can be fabricated out of silicon grown on a preferred crystallographic orientation.

8 Claims, 3 Drawing Figures

SEMICONDUCTOR FIBER OPTICAL DETECTION

DESCRIPTION

1. Technical Field

The technical field of the invention is in the translation of the optical signals in a fiber optic communication system into electrical impulses for use in further signal processing. One of the advantages of fiber optics is the small physical size of optical fibers in relation to the quantity of information that can be transmitted. The small size and the fact that the signals are frequently processed further in semiconductor devices makes it desirable to employ the techniques of integrated circuits in fabricating the assemblies of optical fibers and devices.

2. Background Art

The advantageous relationship of communication by way of optical fibers and the translation of the signals carried therein into electrical signals in semiconductor materials has been shown in U.S. Pat. No. 3,968,564. Further, trapezoidal-shaped optical converters have been employed in semiconductor materials with p-n junctions on the sloping side of the longitudinal direction of the trapezoid as is shown in U.S. Pat. No. 4,131,984. The use of V-grooves for the alignment of optical fibers with a detector has been shown in U.S. Pat. No. 3,994,559. The optical efficiency of the prior art structures, however, has been limited.

DISCLOSURE OF THE INVENTION

In accordance with the invention an optical detector is provided wherein a semiconductor member, having a length, width and height dimension, capable of efficient optical-to-electrical signal translation is positioned with relation to the optical fiber such that it is aligned with one end of the optical fiber. The width dimension of the detector corresponds to the diameter of the optical fiber and has the detector length dimension parallel to the centerline of the optical fiber and the length is further selected for maximum optical signal translation efficiency at the wavelength of the particular optical signal. The body has p- and n-conductivity type regions along the sides of the length dimension so that optically generated carriers are physically close to the point of collection in the p- and n-conductivity type regions.

It has been found, where a silica optical fiber is involved that lower optical dispersion and hence the highest bandwidth will occur at wavelengths between 0.5 micron and 2 microns. The material silicon is advantageous for the detector body and can be used at wavelengths within that range. The material silicon further, has growth and etching properties that are useful in fabrication. The detectors can be fabricated to precise length, width and height dimensions using for example, the property of silicon that when grown on the [100] crystallographic face, the sides and ends when preferentially etched will be sloping along the [111] crystallographic face.

The end aligned with the optical fiber may be equipped with an antireflecting coating.

The detector, so fabricated with proper length, width and height dimensions has nearly 100% quantum efficiency and can be reproduced using standard semiconductor techniques. Further, by forming a second row of semiconductor bodies that is offset by ½ the width dimension, the sides of the bodies form a groove useful for optical fiber alignment.

BEST MODE OF CARRYING OUT THE INVENTION

The description will be directed to the structure and fabrication of a detector using the material silicon although, in the light of the principles set forth, it will be apparent to one skilled in the art that the properties of other materials can advantageously be used.

Figure 1:
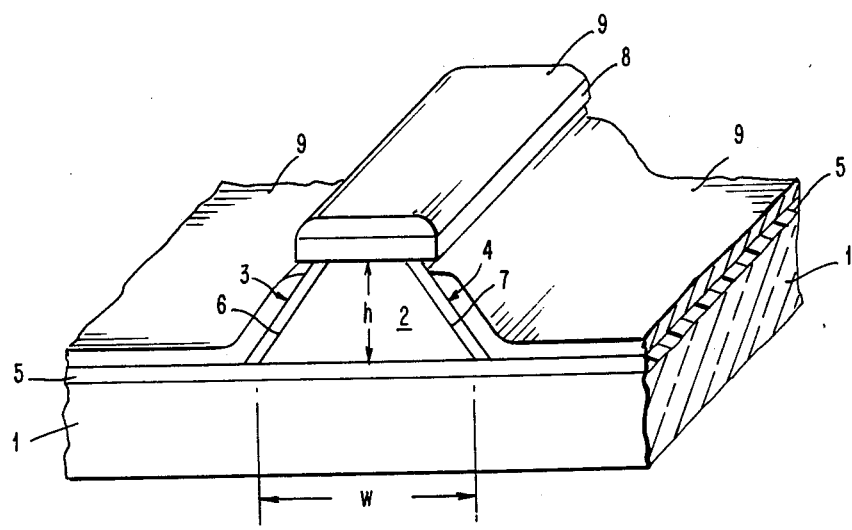
FIG. 1 is an illustration of the high quantum efficiency semiconductor optical fiber detector.

Referring to FIG. 1, there is provided on an insulating substrate 1, a body of semiconductor material 2 having longitudinal sides 3 and 4, respectively. The body 2 may be provided as a separate [100] crystallographic oriented wafer that is bonded to the substrate at a region 5 that may be an oxide. Under these conditions the sides 3 and 4 will etch more rapidly in a preferential etchant along the [100] crystallographic orientation exposing [111] crystallographic faces which will be sloping as shown.

The body 2 is undoped or lightly doped with conductivity type determining impurities. Along side 3 a region of, for example, n-conductivity type 6 is provided and similarly along side 4, a region of p-conductivity type 7 is provided. The regions 6 and 7 may be formed by angled ion implanation. An etching mask such as an oxide layer 8, initially provided for the dimension control of the etching of the body 2 from the starting wafer, covers the top of the body 2, the sides 3 and 4 of which are undercut. A metal layer is then provided by the technique of vacuum deposition through a shadow mask which prevents metal from covering the sloping ends, one of which is the face covered by element 11 in FIG. 2. The metal layer 9, due to the undercut is in three parts. It provides electrical contact to the n region 6 and to the p region 7 and in addition it provides an optically reflecting cover for the signals being converted in the body 2.

Figure 2:
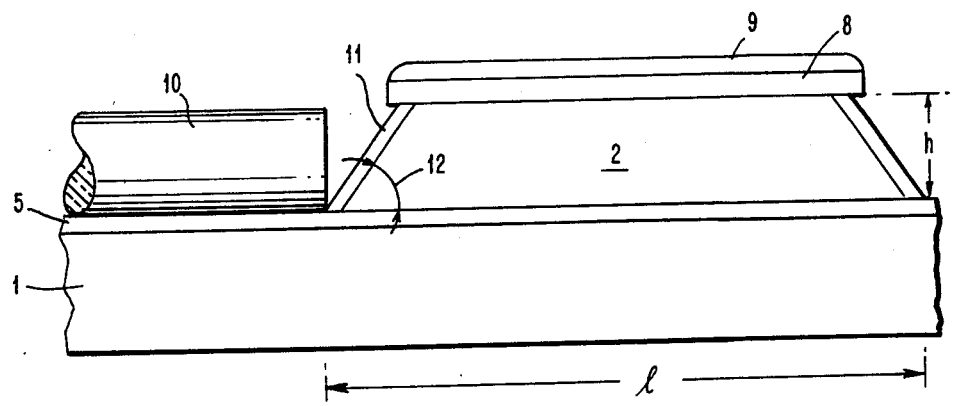
FIG. 2 is an illustration of the alignment of an optical fiber with the end of the detector of the invention.

The width dimension labeled w is of the order of the diameter of the optical fiber containing the signals which are to be detected and should be at least as wide as the optical fiber diameter. The length dimension, labeled l in FIG. 2, is determined by the optical conversion efficiency of the material of the body 2 for the wavelength of the signal delivered by the optical fiber. The length l and width w dimensions are established by the length and width dimensions of the layer 8. The height dimension, labeled h in both FIG. 1 and FIG. 2 is of the order of the diameter of the optical fiber and is selected by the thickness of the wafer from which the body 2 is formed.

Referring next to FIG. 2, further details of the structure are brought out in which an optical fiber 10 that carries the signals to be processed is aligned with the body 2. An antireflecting coating 11 covers the face next to the fiber 10. Since the body 2 is formed by preferentially etching [100] crystallographically oriented silicon, the ends and the sides will be parallel with the [111] crystallographic plane and will form a 54.7° angle labeled 12 with the substrate. The length dimension, l, is the distance between the end faces of the body 2.

In accordance with the invention the detector achieves a high quantum efficiency by selecting dimensions such that there is complete optical absorption. This is accomplished in accordance with the invention by selecting the material of the body 2 and the optical length l within the body 2 to be such that the attenuation of the wavelength of the light being detected is essentially complete.

A high collection efficiency of the optically generated carriers is achieved because the regions 6 and 7 are located within a few microns of where hole electron pairs are formed. The use of the optical antireflecting coating 11 assures high efficiency optical transfer from the fiber 10 into the body 2. The metal 9 over the oxide 8 serves as an internal reflector of the light energy propagating along the body 2.

As an illustration of the high degree of absorption in accordance with the invention, the following example is provided for an optical signal of 1.06 micron wavelength. Such a wavelength is available from standard electroluminescent diode sources. A w dimension of $5\mu$ and an h dimension of $2\mu$ are used for a $2\mu$ optical fiber.

Equation 1:

$$P/P_o = \exp(-\alpha_{Si} l)$$

where
P is optical power at distance l
$P_o$ is optical power entering body 2
$\alpha_{Si}$ is the optical absorption coefficient.
where
$\alpha_{Si}$ at 1.06 $\mu m = 11$ cm$^{-1}$ l=dimension 12=3500 $\mu m = 0.35$ cm
thus
$P/P_o = \exp(-11.0 \times 0.35) = 2.1 \times 10^{-2} = 2.1\%$
hence approximately 98% of the light is absorbed.

The fast time in response for the detector of the invention is achieved by the very short distance the optically generated carriers must travel to be collected, that is, from their point of generation in the body 2 along the dimension l between the regions 6 and 7. The body 2 is fully depleted of carriers either by reverse biasing or by the selection of undoped or lightly doped material for the body 2.

Under these conditions, the carriers that are optically generated are transported by the drift mechanism which is very rapid rather than by the much slower diffusion process which is the dominant collection mechanism in many prior art optically responsive devices.

The following example is provided to illustrate the detector rise time. The example adds the drift time across the width dimension w, to the time required for light to traverse the length l.

Equation 2:

$$t_{rise} = (w/V_{sl}) + (ln_{Si}/c)$$

where
$w = 5 \times 10^{-4}$ cm,
$V_{sl} = 1 \times 10^7$ cm/sec = scattering limited velocity
$l = 0.35$ cm,
$c = 3 \times 10^{10}$ cm/sec and
$n_{Si} = 3.6$
thus
$t_{rise} = (5 \times 10^{-4}/1 \times 10^7) + (0.35/3 = 10^{10}) 3.6$
$t_{rise} = 5 \times 10^{-11} + 4.2 \times 10^{-11}$ sec
$t_{rise} = 92 \times 10^{-12}$ sec From the above it will be apparent that the detector can have a rise time less than 100 pico seconds.

Figure 3:
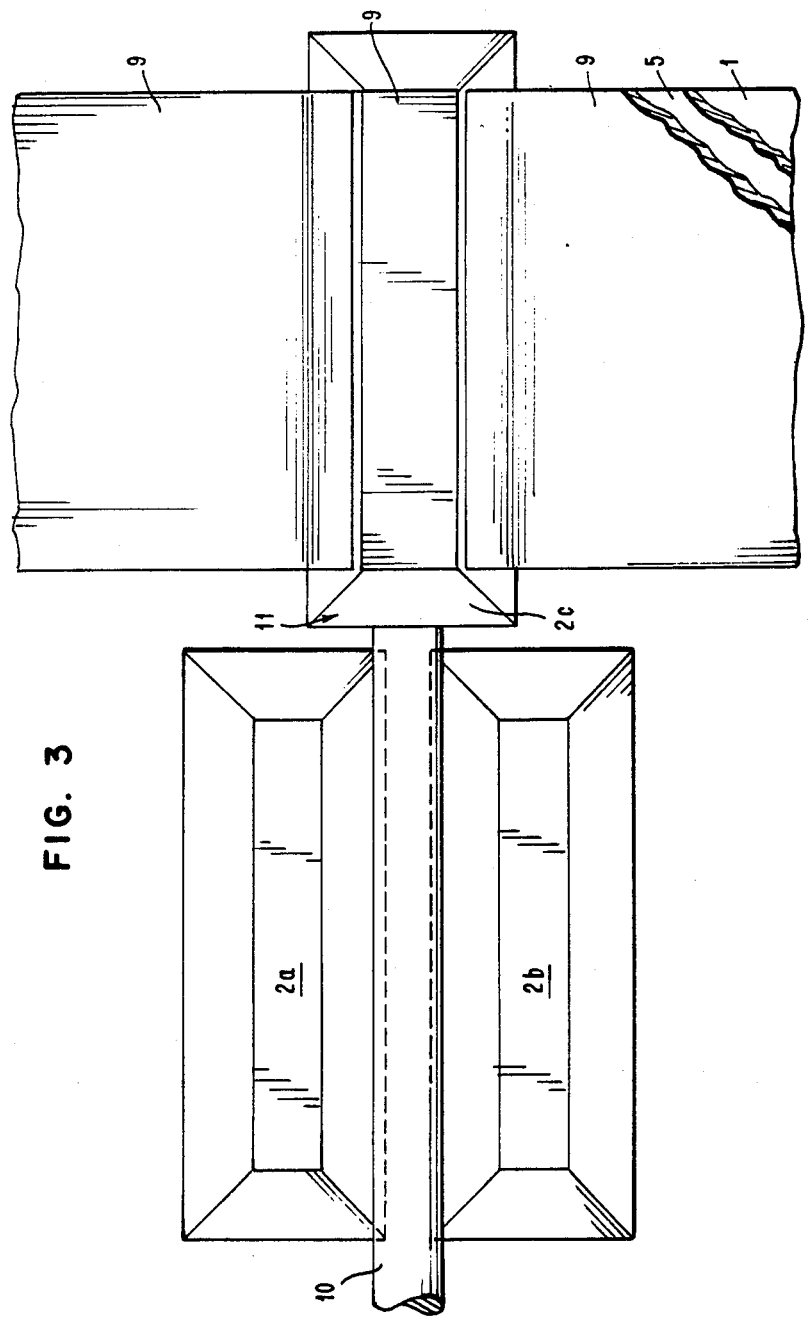
FIG. 3 is an illustration showing the alignment of optical fibers.

Referring next to FIG. 3, there is shown a plan view of a section of an array that illustrates the simplicity of fiber alignment. Detectors of the type of the invention can be positioned on a substrate using photolithographic techniques. Further by offsetting two bodies one-half of the dimension w, the groove between the bodies can be employed for optical fiber alignment with a detector.

In FIG. 3 the groove between the bodies 2a and 2b is aligned with the end body 2c so that when the optical fiber 10 is positioned therein, alignment with the detector body 2c is complete. Where the body 2 is etched from [100] silicon, the sides will be sloping and parallel to the [111] crystallographic plane and the V groove so produced will enhance the simplicity of alignment.

What has been described is a technique of providing a high quantum efficiency detector wherein the elements of the structure contribute to the efficiency of the device and also to its processing steps.

Having described the invention, what is claimed as new and what is desired to secure by Letters Patent is:

1. A coupler for converting light signals transmitted by an optical fiber to electrical signals wherein the optical path in said coupler is longer than the length dimension of said coupler comprising in combination:
   a coupler body of semiconductor material having a length dimension governed by the optical absorption coefficient of said semiconductor material and the wave length of said light signals and having width and height dimensions less than said length dimension;
   a region of p conductivity type along a first side of said body essentially parallel to said length dimension and having an external electrical connection;
   a region of n conductivity type along a second side of said body opposite to said first side and having an external electrical connection;
   internal reflection means on each of the remaining sides of said body that are essentially parallel to said length dimension; and
   alignment means positioning the end of an optical fiber adjacent one end of said body with the axis of said optical fiber parallel with said length dimension of said body.

2. The coupler of claim 1 wherein said l dimension is governed by the optical absorption coefficient of the semiconductor material of said body and the wavelength of said transmitted light signals.

3. The coupler of claim 2 wherein said semiconductor material is silicon.

4. A semiconductor optical detector for a silica-based optical fiber having a diameter of the order of the width and thickness of said detector and wherein there is propagated light signals of a wavelength in the vicinity of 0.5 to 2 microns comprising in combination:
   a body of semiconductor material having a length dimension governed by the optical absorption coefficient of said semiconductor material and the wavelength of said propagated light signals;
   alignment means positioning the end of said optical fiber adjacent to one end of said semiconductor body with the axis of said optical fiber parallel with said length dimension of said semiconductor body;
   an antireflecting coating on the end of said semiconductor body adjacent said optical fiber, said semiconductor body having parallel to said length dimension thereof respectively a p region and an n region separated from each other, an electrical contact to said p and said n region and a reflecting member electrically independent of said p region and said n region and over said semiconductor body.

5. The detector of claim 4 wherein said semicondcutor material is silicon.

6. The process of fabricating a semiconductor body for optical fiber signal detection purposes comprising in combination the steps of:

providing a semiconductor crystal member having broad area first and second surfaces separated by a region having a thickness corresponding to a vertical dimension of said body, said crystal member being oriented so that the fast etch rate crystallographic plane is perpendicular to said first surface;

applying an etch resist on said first surface in a rectangular pattern to define the length and width dimensions of said body;

etching said crystal member forming thereby said semiconductor detector body having a shape that slopes away from said etch resist along a slower etch rate crystallographic plane along both sides and along at least one optical fiber signal receiving end;

forming p and n conductivity type regions along respectively each sloping side;

providing an ohmic contact each to said p and n regions; and providing optical fiber retention means aligning the axis of an optical fiber with said optical fiber signal receiving end of said body.

7. The process of claim 6 wherein said optical fiber retention means is the groove between identical bodies in an adjacent row having each intersection between pairs of members in the adjacent row aligned with the centerline of a detector body.

8. The process of claim 6 wherein said semiconductor crystal member is silicon, said fast etch rate crystallographic plane is 100 and said slow crystallographic plane is 111.

* * * * *